(12) United States Patent
Liu et al.

(10) Patent No.: US 7,713,846 B2
(45) Date of Patent: May 11, 2010

(54) PROCESS APPLIED TO SEMICONDUCTOR

(75) Inventors: Ru-Sheng Liu, Tianchun (TW);
Han-Lung Tsai, Tantzu (TW);
Cheng-Hsu Hsiao, Nanto (TW)

(73) Assignee: Siliconware Precision Industries Co., Ltd., Tantzu Taichung (TW)

( * ) Notice: Subject to any disclaimer, the term of this patent is extended or adjusted under 35 U.S.C. 154(b) by 182 days.

(21) Appl. No.: 12/104,947

(22) Filed: Apr. 17, 2008

(65) Prior Publication Data

US 2008/0213980 A1    Sep. 4, 2008

Related U.S. Application Data

(63) Continuation-in-part of application No. 11/319,110, filed on Dec. 27, 2005, now abandoned.

(30) Foreign Application Priority Data

Dec. 29, 2004    (TW) ............................... 93141194 A

(51) Int. Cl.
*H01L 21/76*    (2006.01)
(52) U.S. Cl. .................... 438/464; 438/68; 438/113; 438/114; 438/463
(58) Field of Classification Search ......... 438/113–114, 438/460–464, 68
See application file for complete search history.

(56) References Cited

U.S. PATENT DOCUMENTS

| | | | |
|---|---|---|---|
| 6,159,071 A | 12/2000 | Koma et al. | |
| 6,264,535 B1 | 7/2001 | Chang et al. | |
| 6,527,627 B2 | 3/2003 | Arai | |
| 7,327,041 B2* | 2/2008 | Dotta et al. | ................. 257/783 |
| 2005/0179127 A1 | 8/2005 | Takyu et al. | |
| 2007/0015342 A1 | 1/2007 | Abe | |

FOREIGN PATENT DOCUMENTS

| | | |
|---|---|---|
| JP | 11265928 | 9/1999 |
| JP | 2003059871 | 2/2003 |

OTHER PUBLICATIONS

English language translation of abstract of JP 2003059871.
English language translation of abstract of JP 11265928.
Liu et al; Non-Final Office Action, mailed Sep. 25, 2007, filing date Dec. 27, 2005, U.S. Appl. No. 11/319,110.
Liu et al; Final Office Action, mailed Jan. 17, 2008, filing date Dec. 27, 2005, U.S. Appl. No. 11/319,110.

\* cited by examiner

*Primary Examiner*—Dung A. Le
(74) *Attorney, Agent, or Firm*—Thomas, Kayden, Horstemeyer & Risley

(57) ABSTRACT

A process applied to grinding, dicing, and/or stacking semiconductors is disclosed. One of its features is that after transparent material is stuck on its active surface, a semiconductor is ground from another surface thereof to become thinner, then take advantage of transparency of the transparent material to cut the transparent material and the semiconductor, to obtain at least one smaller semiconductor unit such as die or chip. Another feature is that the transparent material remains sticking to the active surface of the die by an adhesion layer until the die is attached to a carrier or another die, and then the transparent material and the adhesion layer are removed by taking advantage of a function of the adhesion layer: receiving a ray to lose adhesion between it and the active surface. Preferably the ray reaches the adhesion layer via the transparent material stuck on the active surface of the die.

20 Claims, 8 Drawing Sheets ated in U.S. Pat. Nos. 6,527,627, 6,159,071, include
PROCESS APPLIED TO SEMICONDUCTOR

CROSS REFERENCE TO RELATED APPLICATION

This is a continuation-in-part of prior, pending application Ser. No. 11/319,110, filed Dec. 27, 2005, which claims priority to Taiwan Application No. 093141194, filed Dec. 29, 2004.

FIELD OF THE INVENTION

The present invention relates to grinding and/or dividing semiconductor, particularly to attaching and/or stacking at least one ground and/or divided semiconductor onto a device carrier, and specifically relates to attaching and/or stacking a wafer onto a device carrier after grinding and/or dividing the wafer.

BACKGROUND OF THE INVENTION

It is a trend for IC or semiconductor industries to minimize the size of components. For example, each of multiple chips to be stacked conventionally according to U.S. Pat. No. 5,793,108 must be thinned to a thickness of 2~4 mils.

Conventional processes for thinning a chip, such as those disclosed in U.S. Pat. Nos. 6,527,627, 6,159,071, include typical steps as shown in FIGS. 1a-1f. In FIG. 1a, tape 3 is stuck onto the front surface 2 (the surface with bonding pad 6 thereon) of wafer 1, so that the back surface 4 of wafer 1 may be ground by grinding machine 30 (as shown in FIG. 1b) to have a thinner wafer 11 (as shown in FIG. 1c). Subsequently a frame 5 to be used in dividing wafer is stuck onto the back surface 14 of thinner wafer 11 (as shown in FIG. 1d), and the tape 3 on the front surface 2 of thinner wafer 11 is removed thereafter (as shown in FIG. 1e) so that thinner wafer 11 can be divided (or diced) by sawing machine 40 (as shown in FIG. 1f).

Thinner wafer 11, obtained by grinding according to the conventional processes as described above, is always subjected to warpage (as shown in FIG. 2) due to stress residue resulting from grinding, bringing difficulty and trouble for subsequent steps, leading to vulnerability to crack of thinner wafer 11. Furthermore, the chip or die 21 (as shown in FIG. 3) obtained from dividing thinner wafer 11, being so thin, always tends to be subjected to crack 8 when picked up (e.g. picked up by a pick-up head 50 as shown in FIG. 3) during the process of Die Bond in which the chip (or die) 21 is moved to substrate (as shown in FIG. 4). The chip (or die) 21 is also subjected to crack 8 even when it is placed on substrate 7 (also can be seen from FIG. 4).

In order to solve the poor quality problem resulting from thinner wafer, U.S. Pat. No. 6,264,535 disclosed a technology as shown in FIGS. 5a-5e. Referring to FIGS. 5a-5e (based on the technology according to U.S. Pat. No. 6,264,535), after front surface 2 of wafer 1 is sawn (by sawing machine 40) to have recesses 9 (not sawn to bottom), tape 3 is stuck onto front surface 2, and back surface 4 of wafer 1 is ground by grinding machine 30, thereby a group of separated dice 21 are obtained, and frame 12 is then stuck onto back surface 4 of dice 21, subsequently tape 3 is removed from the front surface of the dice 21. Although the process according to U.S. Pat. No. 6,264,535 may likely more or less ease the problem of wafer crack resulting from thinning a wafer, it is subject to much complication (e.g. plural times of sticking tape and frame, etc), and incurs higher cost, not to mention that it is not for solving the problem of crack of thinner die inherent in the die bonding process thereafter. Further reference is made now with respect to JP patent 2003059871 which is for solving similar problem.

According to JP patent 2003059871, a reinforced thin film is stuck to the tape used in grinding a wafer, and the thin film is reinforced by a support layer made of thermo-softening resin with specific storage elasticity. Although the reinforced structure according to JP patent 2003059871 might more or less provide some usefulness in resolving the problem, it requires using specific material, resulting in higher cost and more complication. Still further reference is made now with respect to JP patent 11265928 which is for solving similar problem. According to JP patent 11265928, a wafer to be polished is stuck onto a surface of a specific plate, where the coarseness of the surface is controlled to be in a specific range. The technology according to JP patent 11265928, even if useful, to some extent, for solving the problem inherent in thinning a wafer, is not necessarily helpful to the reduction of process difficulty and product failure rate in the steps following the process of thinning a wafer.

In view of the fact no ideal solution has ever come up, the present invention not only develops a process for related industries to eliminate or reduce negative effect and/or product failure rate resulting from thinning (e.g. grinding) and/or dividing a wafer, but also provides efficacy of simplification and benefit of lowering cost for the process following thinning and/or dividing a wafer.

Difference Between the Present Invention and Prior Arts

One of the main features of the present invention is the dividing step in which a semiconductor (such as a wafer) with transparent material thereon is divided, by taking advantage of transparency of the transparent material, into dice each with the transparent material thereon. The dividing step includes: cutting the transparent material (64 in FIG. 6f of the present application) which is on the active surface (61 in FIG. 6f of the present application) of the wafer, to reach the active surface of the wafer, and cutting the wafer from the active surface to obtain at least a die which has transparent material remaining on its active surface (67 in FIG. 6f of the present application). For example, the transparent material is cut according to a division line on the active surface of the wafer, so that the division line is reached after the transparent material is cut, and the wafer is then cut according to the division line or from the division line to obtain a die. It is by the transparency of transparent material that the wafer with transparent material on its active surface can be cut into dice each with transparent material remaining on the active surface thereof. The dividing step is done after thinning the wafer which has had the transparent material stuck on the active surface thereof.

No prior arts have ever been known which has the same feature as or similar feature to the dividing step of the present invention. Some prior arts are cited as follows to highlight the unique feature of the present invention. All the reference figures and reference numbers mentioned below in regard to these prior arts are not shown in the present application, but shown in their U.S. patent application/Issue Publication.

According to US Patent Application 20070015342 (specifically FIGS. 16-18 thereof), protective tape 2 (FIG. 16 thereof) on the active surface of a wafer is peeled off before cutting the wafer into dice (FIG. 18 thereof). The dividing step according to US Patent Application 20070015342 includes: peeling off the protective tape 2 (FIG. 16 thereof) from the active surface of a wafer, and cutting the wafer from the active surface to obtain dice. In contrast, according to the present invention, the transparent material (64 in FIG. 6f of the present application) on the active surface (61 in FIG. 6f of the present application) of a wafer, together with the wafer, are cut into dice (66 in FIG. 6f of the present application) each with part of the transparent material remaining on the active surface thereof, i.e., the dividing step according to the present invention includes: first cutting (instead of peeling off) the transparent material on the active surface of a wafer, to reach the active surface (specifically, to reach a division line on the active surface) of the wafer, and then cutting the wafer from the active surface (specifically, from the division line on the active surface) to obtain at least a die (66 in FIGS. 6f-6g of the present application). After the dividing step according to the present invention, the transparent material remains on the active surface of the obtained die, providing convenience for processing the obtained die. For example, the transparent material remaining on the obtained die can significantly reduce the chance that the obtained die is hurt when moving it to a carrier.

It is obvious now that there can be no protective tape on the active surface of each die obtained from dividing a wafer into dice according to US Patent Application 20070015342, and each die (specifically the active surface thereof) has no material (such as the transparent material according to the present invention) for its protection when it is processed (e.g. when the obtained die is moved to a wiring substrate 91 as shown in FIG. 20 of the US publication of the prior art). The significant difference between the present invention and US Patent Application 20070015342, results from the fact that the present invention makes use of transparency of the transparent material stuck on the active surface of a wafer, thereby the wafer can be cut into dice without need of taking off the transparent material beforehand. In contrast, prior art US Patent Application 20070015342 has to peel off protective tape from a wafer before cutting the wafer into dice.

According to US Patent Application 20070179127 (specifically FIGS. 3A-3F thereof), after grinding a wafer from its inactive surface to reach the bottom of grooves 33, the wafer has been divided into dice each adhering to adhesive layer 23 which adheres to protection tape 34, each of the dice is then moved up to separate it from the protection tape 34, and adhesive layer 23 is torn off and cut off. In contrast, according to the present invention, after the process of grinding a wafer, the transparent material on the active surface of the wafer is cut to reach the active surface (specifically to reach a division line on the active surface), and then the wafer is cut from its active surface (specifically from a division line on the active surface) to obtain dice, i.e., the dividing step according to the present invention includes: first cutting the transparent material (64 in FIG. 6f of the present application) which is on the active surface (61 in FIG. 6f of the present application) of a wafer, to reach the active surface (specifically to reach a division line on the active surface) of the wafer, and then cutting the wafer from the active surface (specifically from the division line on the active surface) to obtain dice (66 in FIGS. 6f-6g of the present application). The contrast stated above results in the fact that the die obtained from cutting a wafer according to the present invention has transparent material remaining between the active surface thereof and an open space, while the die obtained from cutting a wafer according to the prior art (US Patent Application 20070179127) has adhesive layer and/or protection tape remaining between the active surface thereof and a backholder 36. One feature (transparent material remaining between an open space and the active surface of a die obtained from cutting a wafer) of the present invention provides benefit for processing the die (e.g. for minimizing the chance of hurting the die when moving it to a carrier). The benefit provided by the present invention originates from using transparent material and making use of transparency of the transparent material, which is unique in contrast with known prior arts.

According to U.S. Pat. No. 6,264,535 (admitted prior art shown by FIGS. 5a-5e of the present application), after grinding a wafer 1 from its inactive surface 4, the wafer 1 has been divided into dice 21 with active surface adhering to tape 3, the tape 3 is then peeled off to obtain dice each separated from another as shown in FIG. 5e of the present invention. In contrast, according to the present invention, after grinding a wafer, the transparent material (64 in FIG. 6f of the present application) on the active surface (61 in FIG. 6f of the present application) of a wafer, together with the wafer, are cut into dice (66 in FIG. 6f of the present application) each with part of the transparent material remaining on the active surface thereof and separate from another part (the part of transparent material which is on the active surface of another one of the dice), i.e., the dividing step according to the present invention includes: first cutting the transparent material on the active surface of a wafer, to reach the active surface (specifically, to reach a division line on the active surface) of the wafer, and then cutting the wafer from the active surface (specifically, from the division line on the active surface) to obtain dice (66 in FIGS. 6f-6g of the present application). After cutting a wafer into dice according to the present invention, each die is adhered by one part of transparent material which is on its active surface and is separated from another die, thereby each of the dice can be processed separately and with minimized chance of getting hurt. For example, each of the dice can be moved separately to a carrier with minimized chance of getting hurt.

At least one of the main features of the present invention, which results from using transparent material and making use of transparency of the transparent material, is unique as can be seen from foregoing explanations. Not only one but also the other features of the present invention shall be deemed unique in contrast to prior arts, as will be seen from the following descriptions.

SUMMARY OF THE INVENTION

An object of the present invention is to eliminate or reduce negative effect incurred on the quality of semiconductor product by the process of thinning a semiconductor.

Another object of the present invention is to eliminate or reduce negative effect incurred on the quality of semiconductor product by the process of dividing a semiconductor.

A further object of the present invention is to eliminate or reduce product failure rate in the process (e.g. Die Bonding, Die Stacking) following thinning and/or dividing a semiconductor.

Another further object of the present invention is to provide efficacy of simplification and benefit of lowering cost for the process following thinning and/or dividing a wafer.

The process provided according to the present invention is for applying to a semiconductor including an active surface and an inactive surface, wherein the distance between the active surface and the inactive surface defines an initial thickness of the semiconductor. One aspect of the process comprises: sticking transparent material (e.g. glass, plastic, etc) to the active surface of the semiconductor; grinding the semiconductor from the inactive surface thereof to obtain a new inactive surface of the semiconductor, with the distance between the new inactive surface and the active surface smaller than the initial thickness (e.g. equal to a desired die thickness); and applying a dividing step to the semiconductor via the transparent material (e.g. using a means such as a knife or a sawing machine or an energy beam, to first cut the transparent material and then cut the semiconductor after the means reaches the active surface of the semiconductor) to obtain at least a first die, wherein the first die includes an active surface and an inactive surface, the active surface of the first die is part of the active surface of the semiconductor, the inactive surface of the first die is part of the new inactive surface of the semiconductor, and the active surface of the first die has at least part of the transparent material thereon. An example of the aforementioned energy beam is laser.

One way to stick the transparent material to the active surface of the semiconductor, is that one type of sticking material is spread between the transparent material and the active surface of the semiconductor, i.e., the transparent material and/or the active surface of the semiconductor are/is coated with one type of sticking material, wherein the sticking material is so characterized as to lose capability of sticking to the active surface of the semiconductor when receiving one type of light (e.g. ultraviolet light). By means of transparency of the transparent material, it is assured the type of light can easily reach the sticking material which is between the transparent material and the active surface of the semiconductor, i.e., the type of light can easily reach the sticking material which is between the transparent material and the active surface of the first die, thereby the type of light makes the sticking material lose capability of sticking to the active surface of the semiconductor, i.e., the type of light makes the sticking material lose capability of sticking to the active surface of the first die, thus the transparent material and the sticking material can be easily removed from the first die. For example, moving the first die together with the transparent material onto a device carrier, with the inactive surface of the first die sticking to the device carrier, the type of light can pass the transparent material to reach the sticking material, and make the sticking material lose the capability of sticking to the active surface of the first die, thereby the transparent material and the sticking material can be conveniently removed from the first die, with the first die still on (sticking to) the device carrier.

The sticking material according to the present invention preferably includes a first glue layer, a second glue layer, and a film layer, wherein the first glue layer contacts the transparent material, the second glue layer contacts the active surface of the semiconductor, the film layer is between the first glue layer and the second glue layer, both the film layer and the first glue layer are capable of letting the type of light pass therethrough; the second glue layer, in response to the type of light, makes the sticking material lose capability of sticking to the active surface of the semiconductor. For example, the second glue layer is UV glue (ultraviolet-ray glue), and the type of light is ultraviolet ray.

The dividing step according to the present invention preferably comprises: recognizing via the transparent material at least a line on the active surface of the semiconductor; and dividing the transparent material and the semiconductor according to the line.

If the transparent material according to the present invention is a type of hard material, it can be better for supporting or carrying thin die, thus significantly avoiding the crack of thin die.

The number of die/dice obtained from the dividing step according to the present invention, is not limited to one, and may be more than one. For better description, let another one among the obtained plural dice called "second die". Obviously the second die also includes an active surface and an inactive surface, wherein the active surface of the second die is part of the active surface of the semiconductor, the inactive surface of the second die is part of the new inactive surface of the semiconductor, and the active surface of the second die also has at least part of the transparent material thereon. Thus the process according to the present invention may further comprise: obtaining at least a second die by the dividing step, the second die including an active surface and an inactive surface, the active surface of the second die being part of the active surface of the semiconductor, the inactive surface of the second die being part of the new inactive surface of the semiconductor, the active surface of the second die having at least part of the transparent material thereon; stacking the second die to the first die, i.e., sticking the inactive surface of the second die to the active surface of the first die (to form a stack of two or more dice); letting the type of light pass the transparent material to reach the sticking material which is between the transparent material and the second die, thereby making the sticking material lose the capability of sticking to the second die; and removing the transparent material and the sticking material from the second die.

The process may preferably further comprise: before connecting the first die to the device carrier, spreading an adhesive onto at least one selected from between a surface of the device carrier and the inactive surface of the first die, i.e., coating a surface of the device carrier and/or the inactive surface of the first die with an adhesive; and before stacking the second die to the first die, spreading an adhesive onto at least one part selected from between the inactive surface of the second die and the active surface of the first die, i.e., coating the inactive surface of the second die and/or the active surface of the first die with an adhesive. The adhesive used in the process includes at least one type of material selected from between silver paste, nonconductive paste, and B-stage paste, i.e., the adhesive includes silver paste and/or nonconductive paste and/or B-stage paste.

According to the process provided by the present invention, in case the adhesive is B-stage paste, heat is necessary for raising the temperature of the B-stage paste, thereby making the B-stage paste have adhesion capability. Preferably, before heat is applied to the B-stage paste, the first die is stuck to the device carrier via the B-stage paste, and the inactive surface of the second die is stuck to the active surface of the first die via the B-stage paste.

Another aspect of the process provided according to the present invention comprises: sticking transparent material to an active surface of a semiconductor; grinding the semiconductor from an inactive surface of the semiconductor to obtain a new inactive surface of the semiconductor, the distance between the new inactive surface and the active surface being smaller than an initial thickness of the semiconductor or equal to a desired die thickness; coating the new inactive surface of the semiconductor with B-stage paste; applying a dividing step to the semiconductor via the transparent material to obtain a first die (or smaller semiconductor, or plural dice, or smaller chips), wherein the first die includes an active surface and an inactive surface, the active surface of the first die is part of the active surface of the semiconductor, the inactive surface of the first die is part of the new inactive surface of the semiconductor, the active surface of the first die has at least part of the transparent material thereon, and the inactive surface of the first die has at least part of the B-stage paste thereon; placing the first die together with the transparent material on a device carrier, with the inactive surface of the first die connecting the device carrier via the B-stage paste; providing heat to raise the temperature of the B-stage paste, so that the B-stage paste becomes capable of sticking the inactive surface of the first die to the device carrier; letting the type of light pass the transparent material to reach the sticking material, so that the sticking material loses capability of sticking to the active surface of the first die; and removing the transparent material and the sticking material from the first die.

As the number of die/dice obtained from the dividing step is not limited to one, the above process may further comprise: obtaining at least a second die by the dividing step, wherein the second die includes an active surface and an inactive surface, the active surface of the second die is part of the active surface of the semiconductor, the inactive surface of the second die is part of the new inactive surface of the semiconductor, the active surface of the second die has at least part of the transparent material thereon, and the inactive surface of the second die has at least part of the B-stage paste thereon; before providing heat to raise the temperature of the B-stage paste on the inactive surface of the first die, letting the inactive surface of the second die connect the active surface of the first die via the B-stage paste; letting the type of light pass the transparent material to reach the sticking material which is between the transparent material and the second die, so that the sticking material loses capability of sticking to the active surface of the second die; and removing the transparent material and the sticking material from the second die. The step of letting the inactive surface of the second die connect the active surface of the first die via the B-stage paste, is not necessarily before providing heat to raise the temperature of the B-stage paste on the inactive surface of the first die. But in case the step of letting the inactive surface of the second die connect the active surface of the first die via the B-stage paste is not before providing heat to raise the temperature of the B-stage paste on the inactive surface of the first die, a second time of providing heat is necessary for raising the temperature of the B-stage paste on the inactive surface of the second die.

As long as the image of the semiconductor (specifically the image of a division line on the active surface of the semiconductor) appearing via the transparent material can be recognized, the transparent material and the semiconductor can be divided (or diced) according to the image of the semiconductor (specifically the image of a division line on the active surface of the semiconductor) seen from the transparent material, to obtain a smaller semiconductor having at least part of the transparent material and at least part of the sticking material thereon. Accordingly a further aspect of the process provided by the present invention comprises:

sticking transparent material to an active surface of a semiconductor via one type of sticking material; grinding the semiconductor from an inactive surface thereof to obtain a new inactive surface of the semiconductor, the distance between the new inactive surface and the active surface of the semiconductor being smaller than an initial thickness of the semiconductor; dividing the transparent material and the semiconductor according to the image of the semiconductor seen from the transparent material, to obtain a smaller semiconductor (e.g. die or chip) having at least part of the transparent material and at least part of the sticking material thereon, i.e., to obtain a smaller semiconductor which is part of the semiconductor but separated from the semiconductor, and which still has at least part of the transparent material and at least part of the sticking material thereon. To remove the transparent material and the sticking material from the smaller semiconductor, apply one type of light to the sticking material which is on the smaller semiconductor, to make the sticking material lose capability of sticking to the smaller semiconductor, thereby the transparent material and the sticking material can be easily separated from the smaller semiconductor. The type of light is applied to the sticking material preferably via the transparent material, and the sticking material either is itself a glue layer or includes a glue layer, wherein the glue layer is characterized by losing capability of sticking to the active surface of the smaller semiconductor in response to receiving the type of light. The glue layer is preferably made of UV glue (ultraviolet-ray glue), and the type of light is preferably ultraviolet ray.

The present invention may best be understood through the following description with reference to the accompanying drawings, in which:

DETAILED DESCRIPTION OF THE PREFERRED EMBODIMENTS

Figure 1A:
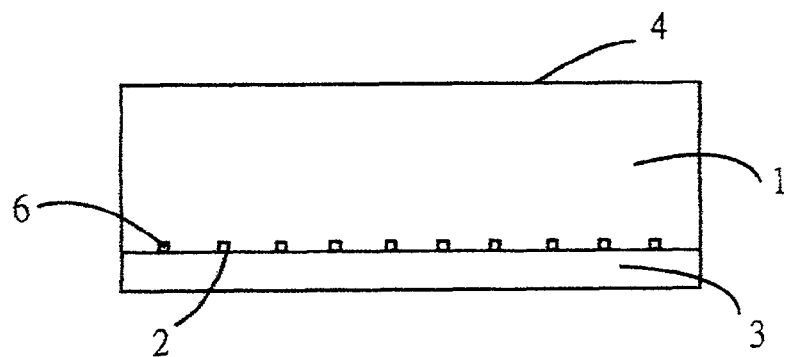
FIGS. 1a-1f show the steps disclosed according to prior arts.
Figure 1B:
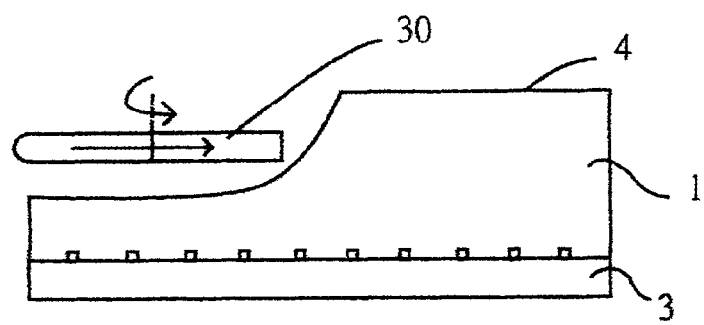
Figure 1C:
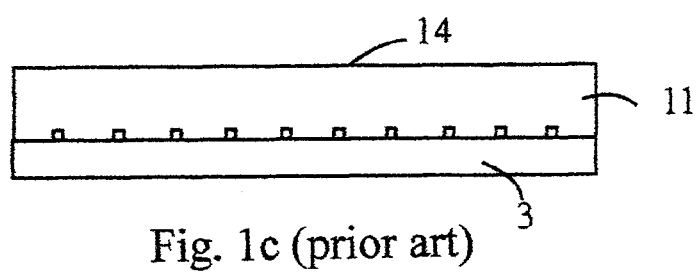
Figure 1D:
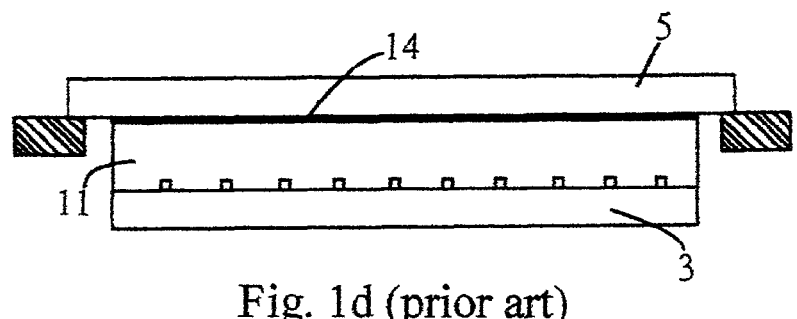
Figure 1E:
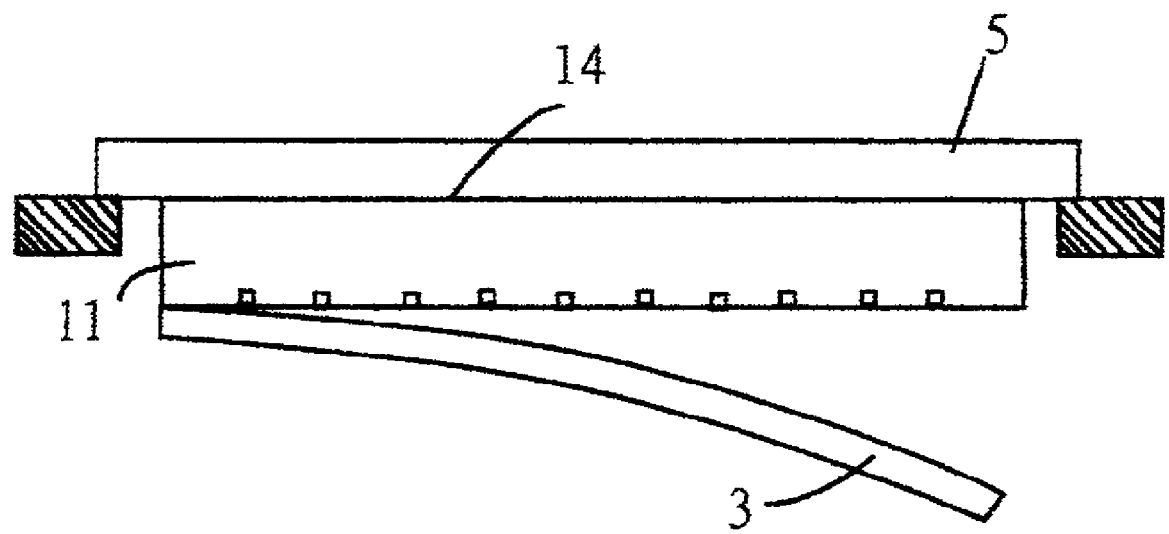
Figure 1F:
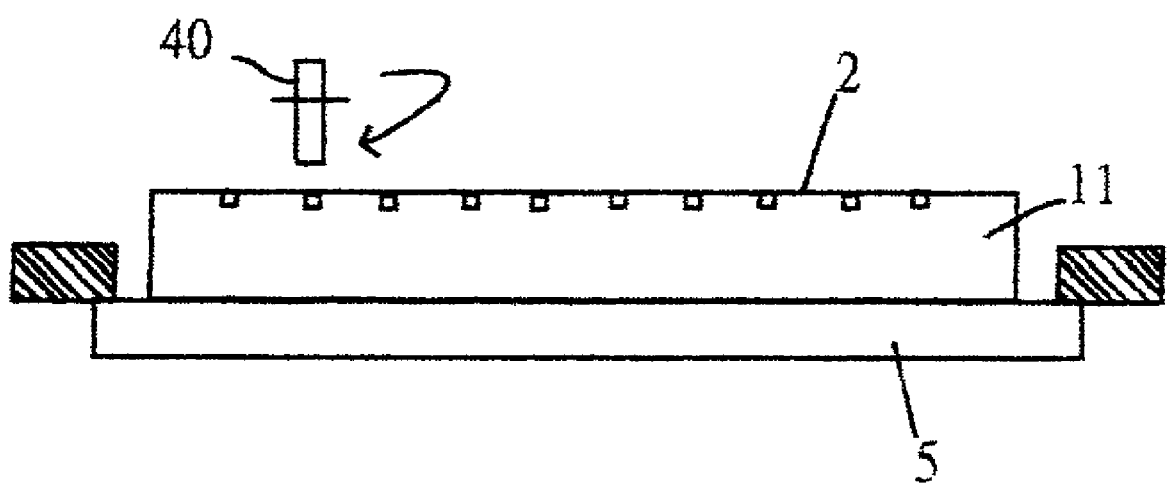
Figure 2:
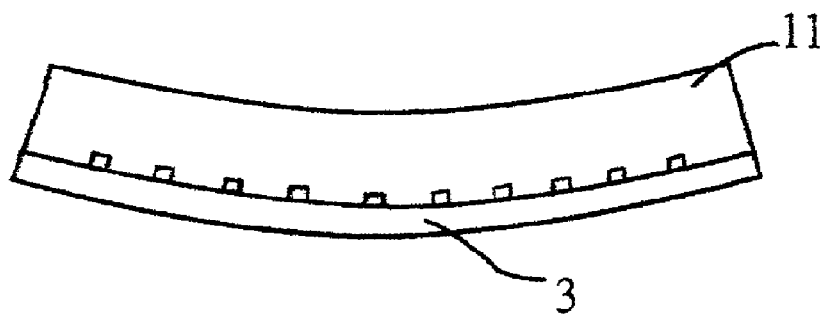
FIGS. 2-4 show some aspects of prior arts to be improved.
Figure 3:
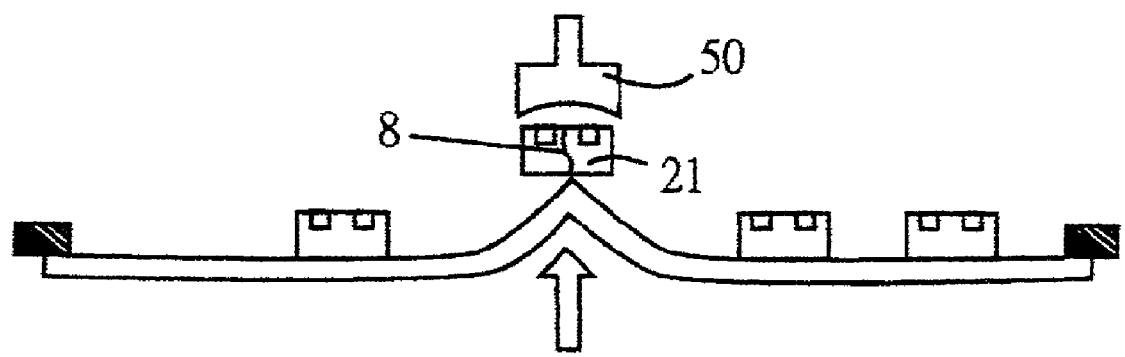
Figure 4:
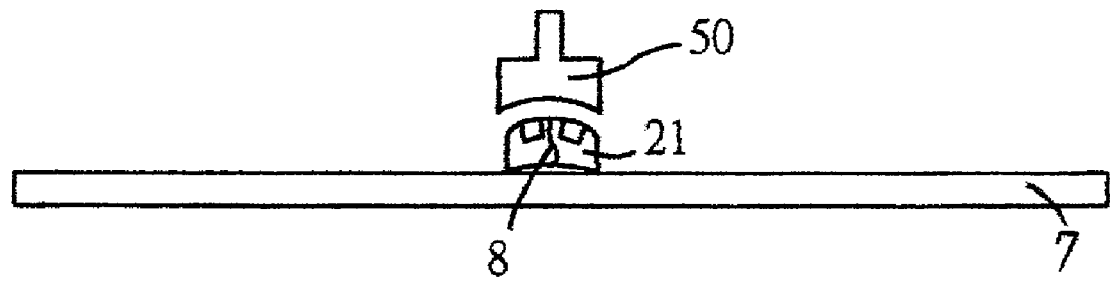
Figure 5A:
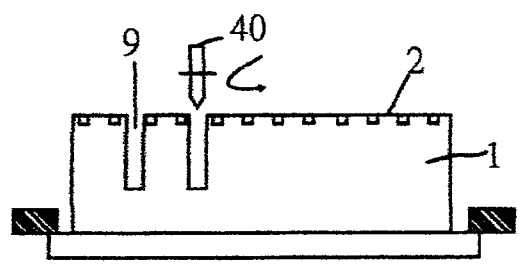
FIGS. 5a-5e show another prior art.
Figure 5B:
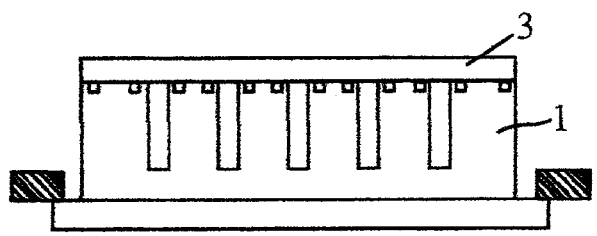
Figure 5C:
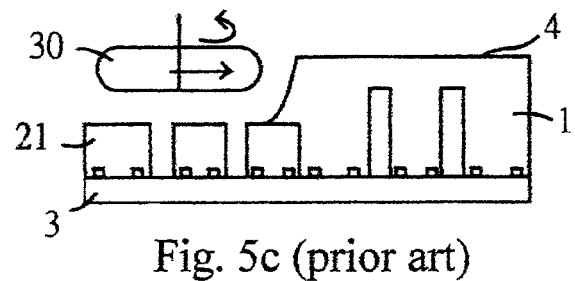
Figure 5D:
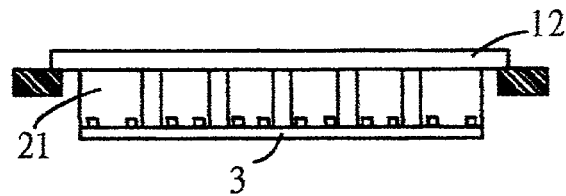
Figure 5E:
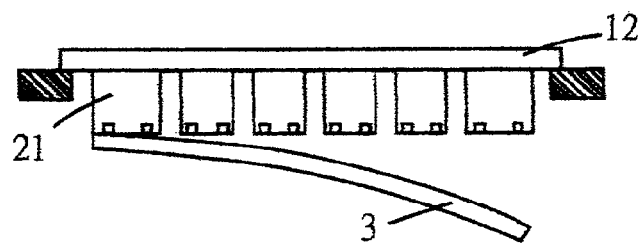

FIGS. 6a-6h show an embodiment representing a first aspect of the process provided according to the present invention. The process is for applying to a semiconductor 60 including an active surface 61 and an inactive surface 62, wherein the distance between the active surface 61 and the inactive surface 62 defines an initial thickness 63 of the semiconductor. The process comprises: sticking transparent material 64 (e.g. glass, plastic, etc) to the active surface 61 of the semiconductor 60; grinding (e.g. using a grinding machine 30 to grind) the semiconductor 60 from the inactive surface 62 to obtain a new inactive surface 65 of the semiconductor 60, with the distance 70 between the new inactive surface 65 and the active surface 61 smaller than the initial thickness 63, i.e., the semiconductor 60 becomes thinner; and applying a dividing step to the semiconductor 60 via the transparent material 64, e.g. applying a sawing machine 40 or another type of means to first cut the transparent material 64 towards the active surface 61, and then (when or after the sawing machine 40 or another means reaches the active surface 61 of the semiconductor 60) cut the semiconductor 60 to obtain at least a first die 66 or smaller semiconductor (e.g. chip or plural dice or plural chips), wherein the first die 66 includes an active surface 67 and an inactive surface 68, the active surface 67 of the first die 66 is part of the active surface 61 of the semiconductor, the inactive surface 68 of the first die 66 is part of the new inactive surface 65 of the semiconductor 60, and the active surface 67 of the first die 66 has at least part of the transparent material 64 thereon, i.e., there is part of transparent material 64 still sticking to the active surface 67 of the first die 66. Preferably, the semiconductor 60 is placed on a grinding supporter (not shown in figures) before being ground, and placed on a sawing supporter 73 before being divided (or diced).

One way to cut the transparent material 64 and the semiconductor 60 is by recognizing a division line (not shown in figures) or a plurality of division lines (not shown in figures) on the active surface 61 of the semiconductor 60, cutting the transparent material 64 toward the division line(s), and cutting the semiconductor 60 according to the division line(s) after the means 40 (sawing machine, or knife, or energy beam) reaches the division line(s). For example, the semiconductor 60 is cut from the division line(s) to obtain dice 66 each with part of the transparent material 64 on its active surface 67.

One way to stick the transparent material 64 to the active surface 61 of the semiconductor 60, is that one type of sticking material 69 is spread between the transparent material 64 and the active surface 61 of the semiconductor 60, or that the transparent material 64 and/or the active surface 61 of the semiconductor 60 are/is coated with sticking material 69, wherein the sticking material 69 is so characterized as to lose capability of sticking to the active surface 61 when receiving one type of light (e.g. ultraviolet light). Taking advantage of transparency of the transparent material 64, it is assured the type of light can easily reach the sticking material 69 which is between the transparent material 64 and the active surface 61 of the semiconductor 60 (i.e., between the transparent material 64 and the active surface 67 of the first die 66), thereby make the sticking material 69 lose capability of sticking to the active surface 61 of the semiconductor 60 (i.e., lose capability of sticking to the active surface 67 of the first die 66), thus the transparent material 64 and the sticking material 69 can be easily removed from the first die 66. An example of moving die 66 together with transparent material 64 and the sticking material 69 is shown in FIG. 6g. According to FIG. 6g, a pick-up head 74 is used to move the first die 66 together with the transparent material 64 onto a device carrier 71 (provided as shown in FIG. 6h), with the inactive surface 68 of the first die 66 connecting (or sticking to) a certain portion of the device carrier 71 (e.g. the first die 66 connecting a surface 76 or part of the surface 76 of device carrier 71), the type of light 72 (as shown in FIG. 7a) is applied to sticking material 69 (by means of transparency of the transparent material 64, light 72 can easily pass transparent material 64 to reach the sticking material 69), and sticking material 69 is turned to lose capability of sticking to the active surface 67 of the first die 66, thus the transparent material 64 and the sticking material 69 can be conveniently removed from the first die 66, with the first die 66 still on (or sticking to) the device carrier 71.

Figure 6A:
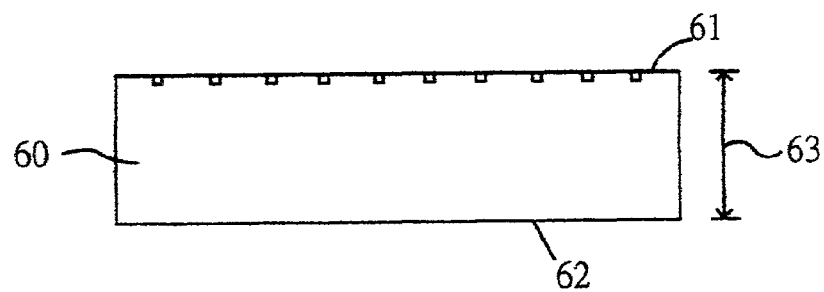
FIGS. 6a-6h show a process representing an embodiment provided according to the present invention.
Figure 6B:
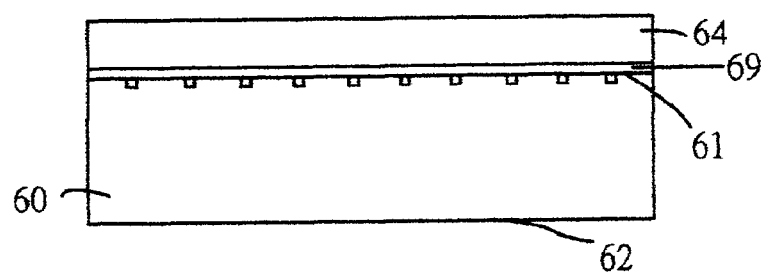
Figure 6C:
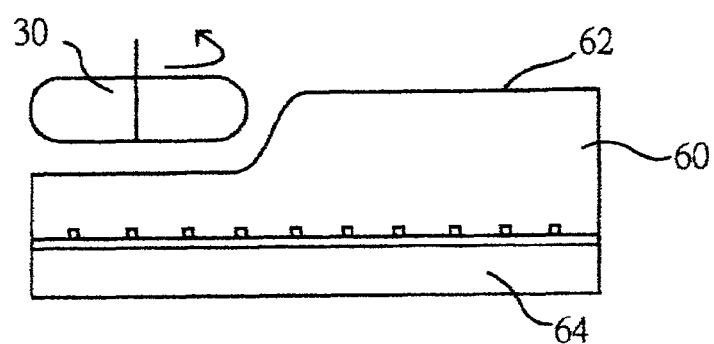
Figure 6D:
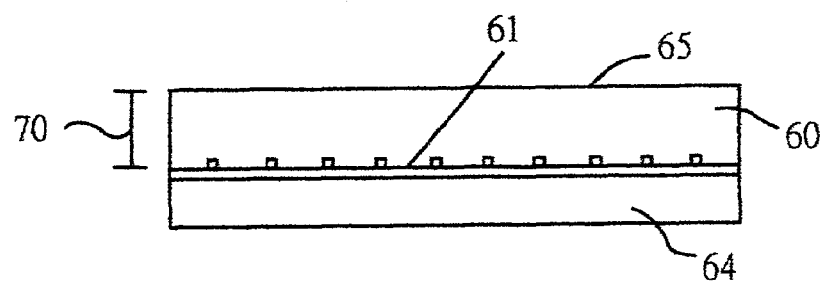
Figure 6E:
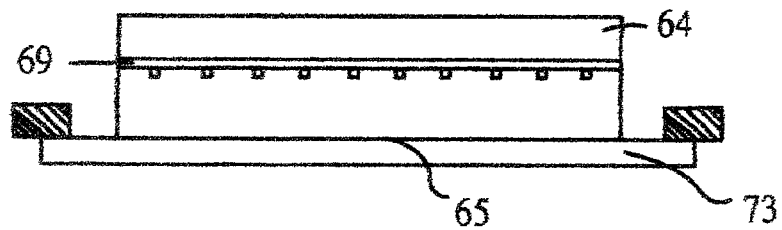
Figure 6F:
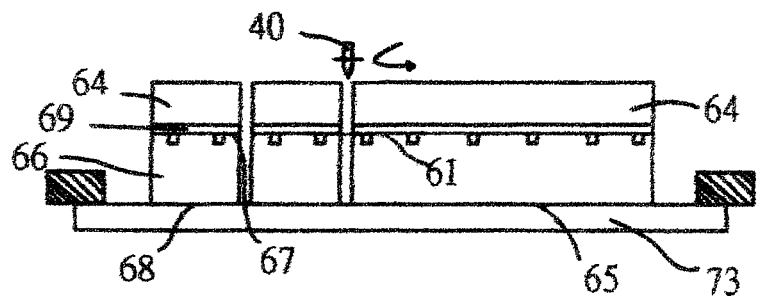
Figure 6G:
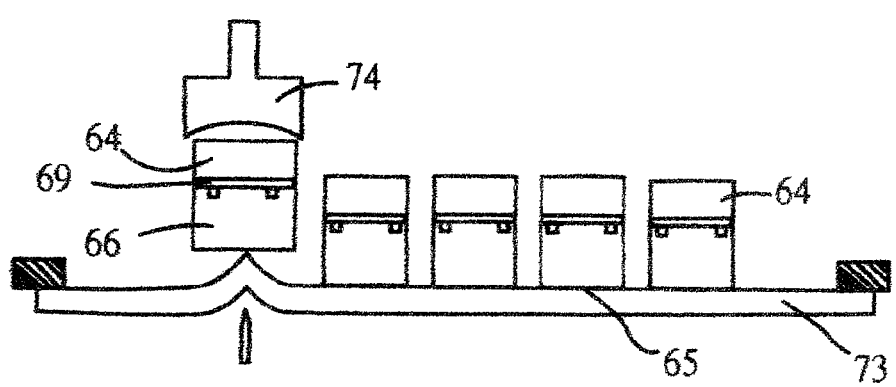
Figure 6H:
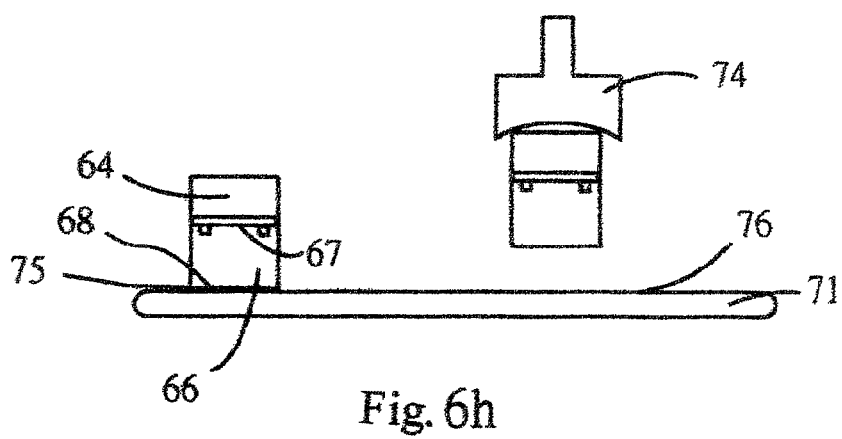
Figure 7A:
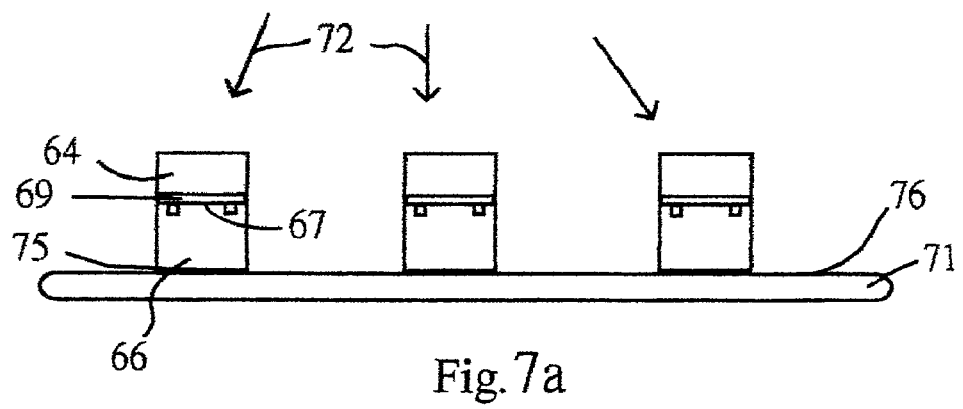
FIGS. 7a-7c show some steps provided according to the present invention, and following the process described by FIGS. 6a-6h.
Figure 7B:
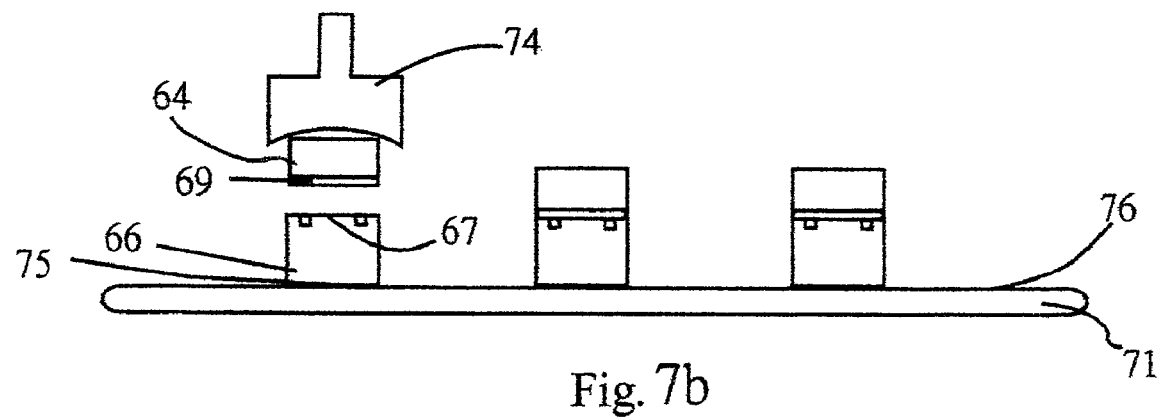

One way of connecting the first die 66 to the device carrier 71, is to coat surface 76 (or a certain portion of surface 76) of device carrier 71 and/or inactive surface 68 of first die 66 with an adhesive 75 (e.g. silver paste, or nonconductive paste, or B-stage paste), as shown in FIGS. 6h, 7a, and 7b. In case adhesive 75 is B-stage paste, heat must be provided to raise the temperature of the B-stage paste, in order to let the B-stage paste capable of providing adhesion.

Figure 7C:
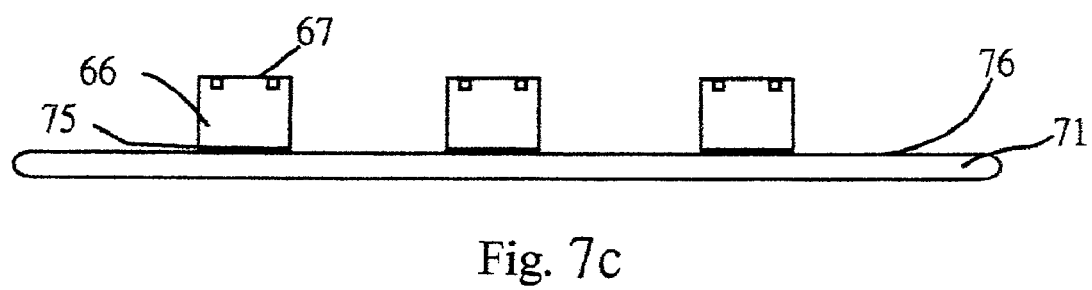

In the process according to FIGS. 7a-7c, plural dice 66 (or chips) obtained from the steps of thinning and dividing semiconductor 60 (as described in FIGS. 6a-6h), are attached to (e.g. with inactive surface stuck to) device carrier 71; and ultraviolet rays 72 are applied to sticking material 69 via transparent material 64, to make sticking material 69 lose capability of sticking to active surface 67 of each first die 66; a pick-up head 74 is then used to remove transparent material 64 and sticking material 69 from each first die 66.

Figure 8A:
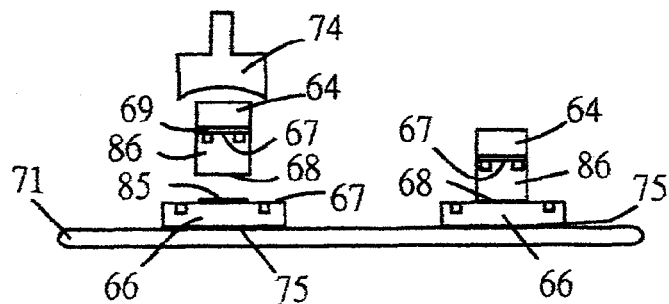
FIGS. 8a-8c show a process representing an embodiment provided according to the present invention for stacking plural dice or chips.

FIG. 8a shows a step of stacking plural dice (or chips). In the step according to FIG. 8a, the first die 66 (or chip) obtained from the steps of thinning and dividing semiconductor 60 (described in FIGS. 6a-6h), is attached to (e.g. with its inactive surface stuck to) device carrier 71; and a second die 86 (or chip) also obtained from the steps as described in FIGS. 6a-6h, is attached to (e.g. with its inactive surface of second die 86 stuck to) active surface 67 of first die 66 (it must be noted both the transparent material 64 and sticking material 69 have been removed from first die 66, as can be seen from FIG. 7b or 7c). The second die 86 also includes an active surface 67 and an inactive surface 68, wherein the active surface 67 of the second die 86 is part of the active surface 61 of the semiconductor 60 (as can be seen from FIGS. 6a-6f), the inactive surface 68 of the second die 86 is part of the new inactive surface 65 of the semiconductor 60 (also as can be seen from FIGS. 6a-6f), and the active surface 67 of the second die 86 also has at least part of the transparent material 64 thereon (again also can be seen from FIGS. 6a-6f).

The second die 86 according to FIG. 8a is stuck to the active surface 67 of first die 66 by using an adhesive 85 (e.g. silver paste, or nonconductive paste, or B-stage paste), i.e., before second die 86 is attached to the active surface 67 of first die 66, active surface 67 of first die 66 and/or inactive surface 68 of second die 86 are/is coated with adhesive 85. As long as second die 86 can be stuck to first die 66, only part of active surface 67 of first die 66 and/or part of inactive surface 68 of second die 86 need/needs to be coated with adhesive 85. In case adhesive 85 is the same as adhesive 75, i.e., is B-stage paste, heat must be provided to raise the temperature of adhesive 85, in order to let the adhesive 85 capable of providing adhesion.

Figure 8B:
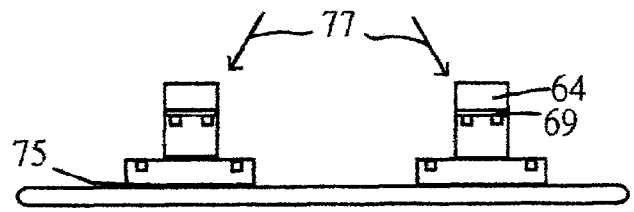
Figure 8:
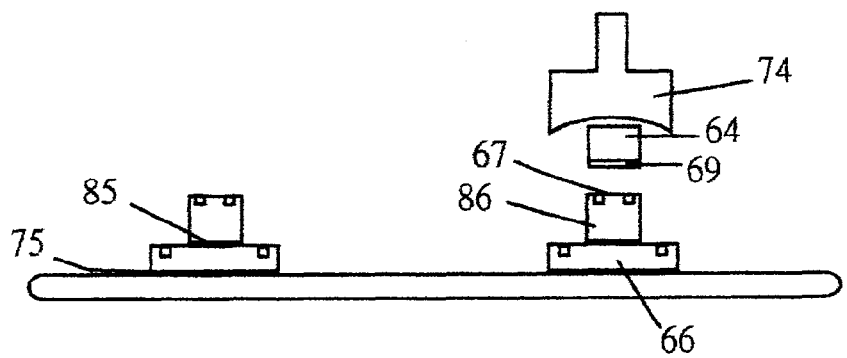

What is shown in FIG. 8b results from the step as shown in FIG. 8a. According to FIG. 8b, ultraviolet rays 77, analogue with light 72 as shown in FIG. 7a, are applied to sticking material 69 (i.e., applied to the material 69 sticking to active surface 67 of second die 86) via transparent material 64, in order to make sticking material 69 lose capability of sticking to active surface 67 of second die 86. A pick-up head 74, as shown in FIG. 8c, is then used to remove transparent material 64 and sticking material 69 from second die 86 (i.e., from active surface 67 of second die 86).

Alternatively, in the process provided according to the present invention, if the new inactive surface 65 (65 is shown in FIG. 6d, but 75 and 85 not) is coated with adhesive 75 (or 85) right after semiconductor 60 is thinned (e.g. after semiconductor 60 is ground by grinding machine 30, as shown in FIG. 6d) but before semiconductor 60 is divided, then the inactive surface 68 of each of the plural dice or chips (such as first die 66 in FIG. 6f and second die 86 in FIG. 8a) obtained from dividing semiconductor 60, will otherwise all have adhesive 75 (or 85) thereon, thereby the inactive surface 68 of first die 66 can be stuck to device carrier 71 by means of adhesive 75 (or 85), and the inactive surface 68 of second die 86 can be stuck to the active surface 67 of first die 66 also by means of adhesive 75 (or 85), as shown in FIG. 8c.

Both adhesive 75 and adhesive 85 shown in FIGS. 8a-8c may include silver paste and/or nonconductive paste and/or B-stage paste. If adhesive 75 and adhesive 85 are B-stage paste or include B-stage paste, heat must be provided to raise their temperature after first die 66 is attached to device carrier 71 and second die 86 is attached to first die 66. The heat is to make adhesive 75 and adhesive 85 capable of providing adhesion.

Figure 9:
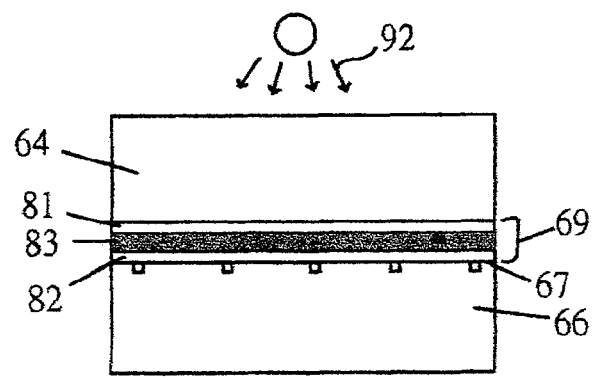
FIG. 9 shows a structure representing an embodiment of the sticking material used in the process provided according to the present invention.

An embodiment of sticking material 69 is shown in FIG. 9. The sticking material 69 according to FIG. 9 is a slice of ultraviolet film (UV film) including a first glue layer 81, a second glue layer 82, and a film layer 83, wherein the first glue layer 81 contacts the transparent material 64, the second glue layer 82 contacts the active surface of the semiconductor (e.g. active surface 61 of semiconductor 60, active surface 67 of first die 66 and second die 86), the film layer 83 is between the first glue layer 81 and the second glue layer 82, both the film layer 83 and the first glue layer 81 are capable of letting one type of light (e.g. ultraviolet ray) pass therethrough; the second glue layer 82 is made of ultraviolet paste (UV paste) which, in response to ultraviolet light applied thereto, will lose capability of providing adhesion. For example, when receiving ultraviolet rays 92, the second glue layer 82 loses capability of providing adhesion, i.e., when ultraviolet rays 92 reach second glue layer 82, the second glue layer 82 loses capability of providing adhesion, and the sticking material 69 loses capability of sticking to the active surface of the semiconductor (e.g. active surface 67 of first die 66 or second die 86, or active surface 61 of semiconductor 60), thereby the transparent material 64 and the sticking material 69 can be easily removed from the active surface (e.g. active surface 67 of first die 66 or second die 86, or active surface 61 of semiconductor 60). Preferably the ultraviolet rays 92 reach second glue layer 82 by passing transparent material 64, first glue layer 81, and the film layer 83.

While the invention has been described in terms of what are presently considered to be the most practical or preferred embodiments, it shall be understood that the invention is not limited to the disclosed embodiment. On the contrary, any modifications or similar arrangements shall be deemed covered by the spirit of the present invention.

What is claimed is:

1. A process applied to a semiconductor wherein said semiconductor includes an active surface and an inactive surface, the distance between said active surface and said inactive surface defines an initial thickness of said semiconductor, said process comprising:
    sticking transparent material to said active surface;
    grinding said semiconductor from said inactive surface to obtain a new inactive surface, the distance between said new inactive surface and said active surface being smaller than said initial thickness; and
    a dividing step wherein a means is used to first cut said transparent material, and then cut said semiconductor after said means reaches said active surface, thereby obtain at least a first die, said first die including an active surface and an inactive surface, the active surface of said first die being part of said active surface, said inactive surface of said first die being part of said new inactive surface, and the active surface of said first die having at least part of said transparent material thereon.

2. The process according to claim 1 further comprising: before grinding said semiconductor, placing said semiconductor together with said transparent material on a grinding supporter, with said inactive surface exposed; and before said dividing step, placing said semiconductor together with said transparent material on a dividing supporter, with said inactive surface facing said dividing supporter and with said transparent material exposed.

3. The process according to claim 1 wherein one type of sticking material is spread between said transparent material and said active surface for sticking said transparent material to said active surface, said sticking material losing capability of sticking to said active surface when receiving one type of light.

4. The process according to claim 3 further comprising:
    letting said type of light reach said sticking material to make said sticking material lose capability of sticking to said active surface; and
    removing said transparent material and said sticking material from said first die.

5. The process according to claim 3 further comprising:
    moving said first die together with said transparent material onto a device carrier, with said inactive surface connecting said device carrier;
    letting said type of light reach said sticking material via said transparent material, to make said sticking material lose the capability of sticking to said active surface; and
    removing said transparent material and said sticking material from said first die.

6. The process according to claim 3 wherein said type of light is ultraviolet ray.

7. The process according to claim 1 wherein said transparent material includes at least one type of material selected from glass and plastic.

8. The process according to claim 1 wherein said dividing step comprises recognizing via said transparent material at least a division line on said active surface, and wherein said transparent material and said semiconductor are cut according to said division line.

9. The process according to claim 5 further comprising:
    obtaining at least a second die by said dividing step, said second die including an active surface and an inactive surface, the active surface of said second die being another part of said active surface, the inactive surface of said second die being another part of said new inactive surface, and the active surface of said second die having at least part of said transparent material thereon;
    sticking the inactive surface of said second die to the active surface of said first die;
    letting said type of light pass said transparent material to reach said sticking material which is between said transparent material and said second die, thereby making said sticking material lose the capability of sticking to said second die; and
    removing said transparent material and said sticking material from said second die.

10. The process according to claim 5 further comprising, before the inactive surface of said first die connects said device carrier, spreading an adhesive onto at least one selected from between a surface of said device carrier and the inactive surface of said first die, wherein said adhesive includes at least one type of material selected from between silver paste, nonconductive paste, and B-stage paste.

11. The process according to claim 9 further comprising: before sticking the inactive surface of said second die to said first die, spreading an adhesive onto at least one selected from between the inactive surface of said second die and the active surface of said first die.

12. The process according to claim 11 wherein said adhesive includes at least one type of material selected from between silver paste, nonconductive paste, and B-stage paste.

13. The process according to claim 3 further comprising:
    providing a device carrier;
    spreading B-stage paste onto at least one selected from between a connection surface of said device carrier and the inactive surface of said first die;
    placing said first die on said device carrier, with the inactive surface of said first die connecting the connection surface of said device carrier via said B-stage paste;
    providing heat to raise the temperature of said B-stage paste, so that said B-stage paste becomes capable of sticking the inactive surface of said first die to the connection surface of said device carrier;
    letting said type of light pass said transparent material to reach said sticking material, so that said sticking material loses capability of sticking to the active surface of said first die; and removing said transparent material and said sticking material from said first die.

14. The process according to claim 13 further comprising:
obtaining at least a second die by said dividing step, said second die including an active surface and an inactive surface, the active surface of said second die being another part of said active surface, the inactive surface of said second die being another part of said new inactive surface, the active surface of said second die having at least part of said transparent material thereon;
spreading B-stage paste onto at least one selected from between the inactive surface of said second die and the active surface of said first die;
before providing heat, letting the inactive surface of said second die connect the active surface of said first die via said B-stage paste;
letting said type of light pass said transparent material to reach said sticking material which is between said transparent material and said second die, thereby making said sticking material lose the capability of sticking to said second die;
removing said transparent material and said sticking material from said second die.

15. A process applied to a semiconductor wherein said semiconductor includes an active surface and an inactive surface, the distance between said active surface and said inactive surface defines an initial thickness of said semiconductor, said process comprising:
sticking transparent material to said active surface;
grinding said semiconductor from said inactive surface to obtain a new inactive surface, the distance between said new inactive surface and said active surface being smaller than said initial thickness;
spreading B-stage paste onto said new inactive surface;
applying a dividing step to said semiconductor via said transparent material to obtain at least a first die, said first die including an active surface and an inactive surface, said active surface being part of said active surface, said inactive surface being part of said new inactive surface, said active surface having at least part of said transparent material thereon, and said inactive surface having said B-stage paste thereon;
placing said first die together with said transparent material on a device carrier, with the inactive surface of said first die connecting said device carrier via said B-stage paste;
providing heat to raise the temperature of said B-stage paste, so that said B-stage paste becomes capable of sticking the inactive surface of said first die to said device carrier;
letting said type of light pass said transparent material to reach said sticking material, so that said sticking material loses capability of sticking to the active surface of said first die; and
removing said transparent material and said sticking material from said first die.

16. The process according to claim 15 further comprising:
obtaining at least a second die by said dividing step, said second die including an active surface and an inactive surface, the active surface of said second die being another part of said active surface and the inactive surface of said second die being another part of said new inactive surface, the active surface of said second die having at least part of said transparent material thereon, and the inactive surface of said second die having at least part of said B-stage paste thereon;
before providing heat, letting the inactive surface of said second die connect the active surface of said first die via said B-stage paste;
letting said type of light pass said transparent material to reach said sticking material which is between said transparent material and said second die, so that said sticking material loses capability of sticking to the active surface of said second die; and
removing said transparent material and said sticking material from said second die.

17. A process applied to a semiconductor wherein said semiconductor includes an active surface and an inactive surface, the distance between said active surface and said inactive surface defines an initial thickness of said semiconductor, said process comprising:
sticking transparent material to said active surface via one type of sticking material;
grinding said semiconductor from said inactive surface to obtain a new inactive surface, the distance between said new inactive surface and said active surface being smaller than said initial thickness; and
using a means to first cut said transparent material according to an image of said semiconductor seen from said transparent material, and then cut said semiconductor after said means reaches said active surface, thereby obtain a smaller semiconductor, said smaller semiconductor having at least part of said transparent material and at least part of said sticking material thereon.

18. The process according to claim 17 further comprising:
applying one type of light to said sticking material which is on said smaller semiconductor, so that said sticking material loses capability of sticking to said smaller semiconductor, and
removing said transparent material and said sticking material from said smaller semiconductor.

19. The process according to claim 18 wherein said sticking material includes a glue layer which, in response to receiving said type of light, loses capability of sticking to said smaller semiconductor.

20. The process according to claim 19 wherein said glue layer includes ultraviolet paste, and said type of light is ultraviolet ray.

* * * * *